US011428656B2

(12) United States Patent
Akhavan-Tafti et al.

(10) Patent No.: US 11,428,656 B2
(45) Date of Patent: *Aug. 30, 2022

(54) ELECTROLUMINESCENT METHODS AND SYSTEM FOR REAL-TIME MEASUREMENTS OF PHYSICAL PROPERTIES

(71) Applicant: AhuraTech LLC, Brighton, MI (US)

(72) Inventors: Hashem Akhavan-Tafti, Brighton, MI (US); Mojtaba Akhavan-Tafti, Ann Arbor, MI (US); Ali Bolandi, Okemos, MI (US); Richard Handley, Canton, MI (US)

( * ) Notice: Subject to any disclaimer, the term of this patent is extended or adjusted under 35 U.S.C. 154(b) by 621 days.

This patent is subject to a terminal disclaimer.

(21) Appl. No.: 16/376,643

(22) Filed: Apr. 5, 2019

(65) Prior Publication Data
US 2020/0011824 A1    Jan. 9, 2020

Related U.S. Application Data

(63) Continuation-in-part of application No. 16/027,471, filed on Jul. 5, 2018.

(51) Int. Cl.
*G01N 27/02* (2006.01)
*G01N 27/04* (2006.01)
(Continued)

(52) U.S. Cl.
CPC ......... *G01N 27/02* (2013.01); *G01M 11/0207* (2013.01); *G01N 3/02* (2013.01);
(Continued)

(58) Field of Classification Search
None
See application file for complete search history.

(56) References Cited

U.S. PATENT DOCUMENTS 3,774,238 A    11/1973  Ha, Jr.
4,434,657 A     3/1984  Matsumura et al.
(Continued)

FOREIGN PATENT DOCUMENTS

GB      2218812 A    11/1989
KR    101493310 B1    2/2015
(Continued)

OTHER PUBLICATIONS

Kumar et al. "A Review on Capacitive-Type Sensor for Measurement of Height of Liquid Level." Measurement and Control vol. 47(7). 2014. pp. 219-224.
(Continued)

*Primary Examiner* — Patrick Assouad
*Assistant Examiner* — Haidong Zhang
(74) *Attorney, Agent, or Firm* — Harness, Dickey & Pierce, P.L.C.

(57) ABSTRACT

Methods of producing luminescence by application of a time-varying electrical signal to an electroluminescent device are disclosed whereby the entire system remains at open circuit. At least one article, substance or material, the "object", is employed to alter the electrical signal to the area of the electroluminescent device to a level sufficient to change light emission. Methods are disclosed to relate the light intensity thus produced to a property of the object thereby allowing a measurement of the property. The method may optionally use one or more additional circuit components.

45 Claims, 6 Drawing Sheets

(51) Int. Cl.
*G01N 27/22* (2006.01)
*G01M 11/02* (2006.01)
*G01N 25/00* (2006.01)
*G01N 3/02* (2006.01)
*G01R 31/385* (2019.01)

(52) U.S. Cl.
CPC .............. *G01N 25/00* (2013.01); *G01N 27/04* (2013.01); *G01N 27/22* (2013.01); *G01R 31/385* (2019.01)

(56) References Cited

U.S. PATENT DOCUMENTS

| | | | |
|---|---|---|---|
| 4,991,150 | A | 2/1991 | Wixom |
| 5,187,979 | A | 2/1993 | Edmark, III |
| 5,627,522 | A | 5/1997 | Walker et al. |
| 6,104,107 | A | 8/2000 | Avramenko et al. |
| 6,501,846 | B1 | 12/2002 | Dickinson et al. |
| 6,606,399 | B2 * | 8/2003 | Burrows .............. G06K 9/0004 382/124 |
| 6,630,307 | B2 | 10/2003 | Bruchez et al. |
| 6,823,731 | B1 | 11/2004 | Lin |
| 6,856,383 | B1 | 2/2005 | Vachris et al. |
| 7,008,559 | B2 | 3/2006 | Chen |
| 7,501,092 | B2 | 3/2009 | Chen |
| 8,810,778 | B2 | 8/2014 | Stautmeister et al. |
| 9,261,395 | B2 | 2/2016 | Shearer et al. |
| 9,741,948 | B2 | 8/2017 | Berger et al. |
| 10,084,042 | B2 | 9/2018 | Welch et al. |
| 10,241,111 | B2 | 3/2019 | Akhavan-Tafti et al. |
| 2002/0054696 | A1 | 5/2002 | Lee |
| 2003/0151735 | A1 | 8/2003 | Blumenfeld et al. |
| 2004/0252867 | A1 | 12/2004 | Lan et al. |
| 2005/0059031 | A1 | 3/2005 | Bruchez et al. |
| 2007/0095669 | A1 | 5/2007 | Lau et al. |
| 2009/0187357 | A1 | 7/2009 | Ho et al. |
| 2009/0206287 | A1 | 8/2009 | Trupke et al. |
| 2010/0097346 | A1 | 4/2010 | Sleeman |
| 2010/0105035 | A1 * | 4/2010 | Hashsham ............ G01N 21/645 435/6.19 |
| 2010/0185064 | A1 | 7/2010 | Bandic et al. |
| 2011/0021970 | A1 | 1/2011 | Vo-Dinh et al. |
| 2013/0157895 | A1 | 6/2013 | Aimiya et al. |
| 2013/0298667 | A1 | 11/2013 | Bechtel et al. |
| 2013/0334960 | A1 * | 12/2013 | Waffenschmidt ...... H05B 33/08 315/52 |
| 2014/0193841 | A1 | 7/2014 | Welch et al. |
| 2017/0089236 | A1 | 3/2017 | Andersen et al. |
| 2018/0132332 | A1 | 5/2018 | Akhavan-Tafti |

FOREIGN PATENT DOCUMENTS

| | | |
|---|---|---|
| KR | 20160011224 A | 1/2016 |
| WO | 200124586 A1 | 4/2001 |
| WO | 2005107818 A2 | 11/2005 |
| WO | 2017027643 A1 | 2/2017 |

OTHER PUBLICATIONS

Jiayuan Wang. "Liquid Level Sensing Using Capacitive-to-Digital Converters." Analog Dialogue 49-04. Apr. 2015.
Xiaoxhu Gao et al. "In vivo molecular and cellular imaging with quantum dots." Current Opinion in Biotechnology 2005. 16:63-72.
J. Aswathy et al. "Mn doped Zinc Sulphide nanocrystals for immunofluorescent labeling of epidermal growth factor receptors on cells and clinical tumor tissues." Nanotechnology 25 (2014) 445102.
F. Krujatz et al. Exploiting the Potential of OLED-Based Photo Organic Sensors for Biotechnological Applications. Chemical Sciences Journal. vol. 7, Issue 3. 2016.
Ying-Yu Ma et al. "Molecular Imaging of Cancer with Nanoparticle-Based Theranostic Probes." Hindawi. Contrast Media & Molecular Imaging. vol. 2017.
Congcong Mi et al. "Biosynthesis and characterization of CdS quantum dots in genetically engineered *Escherichia coli*." Journal of Biotechnology 153 (2011) 125-132.
Nako Nakatsuka et al. "Self-assembling peptide assemblies bound to ZnS nanoparticles and their interactions with mammalian cells." Colloids and Surfaces B: Biointerfaces 103 (2013) 405-415.
Stefan Niekamp et al. "Nanometer-accuracy distance measurements between fluorophores at the single-molecule level." PNAS. vol. 116, No. 10.
Anja Ostrowski et al. "Overview about the localization of nanoparticles in tissue and cellular context by different imaging techniques." Beilstein Journal of Nanotechnology. 2015, 6, 263-280.
Hiroshi Toda et al. "A Novel Immunohistochemical Staining Method Allows Ultrarapid Detection of Lymph Node Micrometastases While Conserving Antibody." Japan Society of Histochemistry and Cytochemistry 44(3): 133 139.
Jung Ho Yu et al. "High-resolution three-photon biomedical imaging using doped ZnS nanocrystals." Nature Materials. vol. 12.
Yu-Hong Cheng. "Plasmonic gold nanoparticles as multifaceted probe for tissue imaging." Chem Communication. 2019.
International Search Report and Written Opinion dated Oct. 24, 2019 regarding PCT/US2019/040256.
International Search Report completed on Feb. 14, 2022 regarding European Application No. 19830706.8.

* cited by examiner

ELECTROLUMINESCENT METHODS AND SYSTEM FOR REAL-TIME MEASUREMENTS OF PHYSICAL PROPERTIES

CROSS-REFERENCE TO RELATED APPLICATIONS

This application is a continuation-in-part of U.S. patent application Ser. No. 16/027,471 filed on Jul. 5, 2018. The entire disclosure the above application is incorporated herein by reference.

FIELD

The present disclosure relates to methods and devices for generating light from electroluminescent devices under open-circuit conditions. The present disclosure further relates to uses of the present disclosure in the service of test methods and methods of detection.

BACKGROUND

Electroluminescence is hereby defined as the generation of electromagnetic radiation in response to an electrical signal. An electroluminescent (EL) device is further defined as a device which emits electromagnetic radiation in response to an electrical signal. With this definition in mind, electroluminescent devices can include organic and inorganic compounds and materials which convert electrical energy into radiative energy, e.g., infrared radiation and/or visible radiation. For example, U.S. Pat. Nos. 9,756,701, 10,021,761, 10,035,193 and 10,159,136 describe methods for production and applications of inorganic nanocrystals with an average diameter of 5 nm which emit electromagnetic radiation in response to electrical and electromagnetic excitation stimulation.

The state-of-the-art electroluminescent materials enable high contrast-ratio and bright display devices. Electroluminescent materials are used in various applications including light-emitting devices. U.S. Pat. No. 10,241,111 further introduced the use of electroluminescent devices for assay characterization in liquid media. The prior art, in general, uses closed circuit configuration to transmit electrical energy into an electroluminescent device in order to excite and generate electromagnetic radiation. In a typical closed-circuit configuration electrical signal starts at a power source, propagates across circuit elements along an uninterrupted path, and ends at the power source.

The advances in optical detection, amplification, and communication technologies have brought about the opportunity to complement and/or replace electrical means of detection, amplification, and communication systems. The present disclosure is concerned with introducing means of optical detection of physical properties of an object.

This section provides background information related to the present disclosure which is not necessarily prior art.

SUMMARY

This section provides a general summary of the disclosure, and is not a comprehensive disclosure of its full scope or all of its features.

The present disclosure concerns methods, materials and devices for producing electroluminescence. The present invention further concerns methods, materials and devices for producing electroluminescence at open circuit, termed open-circuit electroluminescence (OCEL). In particular, the present disclosure concerns methods of detecting and measuring a property of a material, object or substance based on the ability of the property to cause the generation of electroluminescence in such a method.

In one embodiment there is provided a method for measuring a physical property of an object comprising:

a) transmitting a time-varying electrical signal from a power source to a first terminal of an electroluminescent device, wherein the electroluminescent device remains at open circuit;

b) positioning an object in close proximity to the electroluminescent device while the time-varying electrical signal is transmitted to the electroluminescent device, such that a change in the physical property of the object alters the time-varying electrical signal across the electroluminescent device and thereby changes electromagnetic radiation emitted by the electroluminescent device;

c) measuring the change in electromagnetic radiation emitted by the electroluminescent device; and d) relating the measured change in electromagnetic radiation to the changing physical property of the object.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Figure 1A:
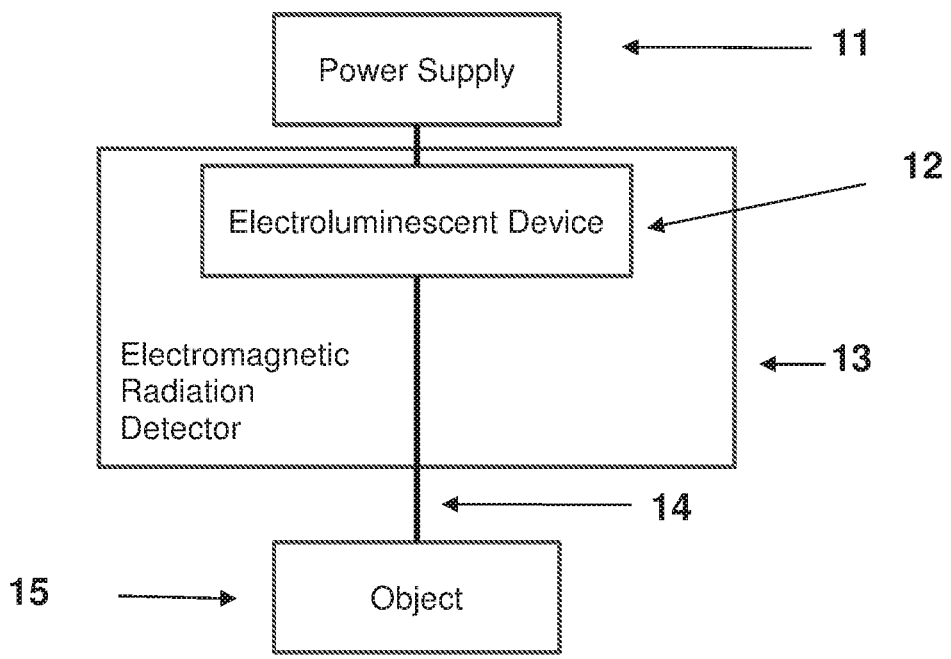
FIG. 1A is a schematic diagram describing an example embodiment of a system for electroluminescence measurement of a contained fluid where an electrical terminal is in direct contact with the fluid.

Example embodiments will now be described more fully with reference to the accompanying drawings.

In the present disclosure, a physical property of an object is determined by a method involving measuring a change in electromagnetic radiation emitted by an electroluminescent device in proximity to the object. Change, as used throughout the present disclosure, includes both increases and decreases in the intensity of electromagnetic radiation. In some embodiments, time-varying electrical signal from a power supply is transmitted to one terminal of an electroluminescent device. An object is set in close proximity to a second terminal of the electroluminescent device, the object configured to cause a change in electromagnetic radiation of the electroluminescent device. The change in electromagnetic radiation of the electroluminescent device is measured by an electromagnetic radiation detector and related to a physical property of the object.

The present disclosure concerns methods, materials, and devices for producing electroluminescence at open circuit, termed open-circuit electroluminescence (OCEL). In particular, the present disclosure concerns methods of measuring a property of an object based on the ability of the property to interrupt the propagation of electrical signal in an open-circuit configuration and, therefore, cause a change in electromagnetic radiation of an electroluminescent device. In the present disclosure, open-circuit describes an electronic circuit where a time-varying electrical signal is transmitted from a power source to an electroluminescent device and other optional circuit components while the electronic circuit remains incomplete. Applicant has discovered that the use of the second additional electrodes and leads that close a circuit from a power source to the electroluminescent device and back to the power supply are not required. The electrical signal in an open-circuit configuration is particularly responsive to changes to physical properties of the media through which it propagates. The present methods take advantage of this responsiveness to the changes to physical properties of the media through which the electrical signal propagates. Here, the changes to electrical signal across an electroluminescent device are detected and related to changes to physical properties of the media through which the electrical signal propagates. In this application, the medium through which the electrical signal propagates is, as described herein generally referred to as an 'object' and can also include, but is not limited to, a material or a circuit component.

Definitions

Circuit Component—An electronic circuit is composed of individual circuit components, such as resistors, capacitors, inductors, solenoids, transformers, thermocouple, thermopile, electrochemical cells, power supplies, filters, diodes, and transistors. Circuit components are operably coupled to the electronic circuit. In some embodiments, conductive wires are used to operably couple a circuit component to an electronic circuit. Once operably coupled to an electronic circuit, a circuit component can impact an electrical signal transmitting through the electronic circuit.

Close Proximity—indicates any close spatial relationship effective for increasing the altering the electric field at the electroluminescent device and includes actual physical contact, or a zero separation distance. Distances greater than zero, i.e. non-contact, can also be used as long as the separation permits electric field alteration. Typical distances in practice will generally be on the order of 1 cm or less, and frequently 1 mm or less. A layer of dielectric material will provide a physical barrier between an electroluminescent device and the test object and thus determine a distance of physical separation. The dielectric so used can have a thickness in the range of 0.001 to 1 mm.

Electroluminescent Device—an electroluminescent device is defined as a device which emits electromagnetic radiation in response to an electrical signal. One type is a light emitting diode or LED. Conventional LEDs feature a semiconductor chip doped to have p and n regions and create a p-n junction and is surrounded by an epoxy shell with anode and cathode wires protruding. Representative semiconductor materials found in LEDs useable in the present methods include GaAs, AlGaAs, GaAsP, AlGaInP, GaP, GaAsP, AlGaP, InGaN, GaN, and ZnSe. LEDs that produce any color in the visible spectrum are included. Electroluminescent device, as used herein, can involve the use of more than one LED bulb to produce electroluminescence including two- or three-dimensional arrays.

Electroluminescent devices of the present disclosure can also comprise an electrode and one or more phosphor materials deposited as a layer on a surface of the electrode. Phosphor materials can be selected from semiconductor particles, doped semiconductor particles, elemental Si particles, elemental Ge particles, quantum dots, fluorescent monomers, fluorescent oligomers, fluorescent polymers, phosphorescent monomers, phosphorescent oligomers, phosphorescent polymers and mixtures thereof. Phosphor materials have at least one of the properties of exhibiting fluorescence, delayed fluorescence or phosphorescence. The phosphor material layer covers at least one discrete region of a surface of the electrode. The regions may be of any shape or dimensions and when a plurality of regions occur may be the same or different in size and shape. Multiple different phosphor materials may be chosen to emit light of a different color, used either together in one region or in discrete regions. In this manner, various patterns may be produced, or different colors of light may result when the regions are small.

Object—as used in the present description refers to substances, materials and articles which exhibit electrical conductivity also are generally considered to be included. An exemplary listing includes, without limitation, metals, metal alloys, other solid substances of any shape or size, including granular or particulate materials and their mixtures, liquids chosen from among polar liquids, as well as mixtures of two or more liquids in any proportion, solutions containing dissolved solutes, other conductive materials such as solid or liquid conductive polymers are considered within the scope of the materials useful in the methods of the present disclosure. Living bodies, including plants and animals, parts of living bodies, a portion of a body tissue or a tissue section can all serve in this capacity in the present methods. As mentioned above, in some methods and applications an added circuit component can also serve as the object as described below. A more expansive description of exemplary materials is set forth in U.S. patent application Ser. No. 16/027,421.

Where the object is a liquid or gaseous substance, it is to be understood that the liquid or gas may be enclosed within a vessel or container. Said vessel or container may contact the electroluminescent device. Common vessels and containers include, cups, test strips, test tubes, microwells, microwell strips or plates, and other conventional containers in common laboratory use. In such embodiments the vessel or container comprises one or more walls having a thickness and the thickness establishes a separation distance between the electroluminescent device and the substance that alters the electric field when used in the present methods.

Physical property—includes any measurable property of an object or substance including, without limitation, volume, mass, area, length, distance, position, orientation, speed, acceleration, displacement, density, concentration in a solution, pH, ionic strength, chemical composition, ratio of two substances in admixture, polarity, electrical potential, electrical charge content, conductivity, resistivity, capacitance, temperature, magnetic permeability, electric permittivity, refractive index, current density, vibration, oscillation, displacement, strain, stress, pressure, reflectivity, transparency, color, relative brightness, texture, rigidity, geometry, moisture content, absorptivity, energy, intensity, amplitude, frequency, mass-to-charge ratio, impurity, connectivity, mobility, viscosity, and pattern.

Power Source—The power source in some embodiments can be a cold cathode fluorescent lamp (CCFL) inverter. CCFL inverter operates at high voltage (few volts to tens of kilovolts) and high frequency (10-50 kHz). CCFL are often used for backlighting liquid crystal display (LCD) panels. The CCFL models include for example: JKL components (BXA-24529, BXA-601), TDK (CXA-M10M-06Y15R, CXA-P1612-VJL, CXA-L0505-NJL), etc. CCFL circuits normally operate at an input voltage of 0-24 VDC. The voltage output of CCFL can be adjusted with modifying the inverter circuit elements and/or changing the input voltage. The latter was accomplished with the use of batteries, AC/DC transformer (adapters), and/or a lab-grade variable direct current (DC) power supply. In particular, VOLTEQ HY3006D is a regulated linear DC power supply and is continuously adjustable at 0-30 VDC and 0-6 A. Plug & play systems are also within the scope of the present disclosure. In this case, the power supply is the typical North American/European power outlet with single-phase unit which has a 0-110/220 VAC output voltage and frequency of 50/60 Hz. Other commercial wave generators can also be used. For instance, the SIGLENT SDG805 5 MHz 125 MSa/s Arbitrary Waveform Generator was used to generate time-varying electrical signal of various waveforms, including sine, square, ramp, pulse, and arbitrary/custom waveforms. The wave generator was further used to generate voltage and frequency sweeps ranging $|Vpp|<20$ volts and $f<5$ MHz, where Vpp and f represent the peak-to-peak voltage and wave frequency, respectively.

Time-varying Electrical Signal—as used in the present disclosure includes modulating electrical signals such as an alternating current having a sinusoidal waveform of a wide range of frequencies. Frequencies useful in the practice of the present methods can range from 1 Hz to 200 kHz, or in some embodiments from 20 kHz to 50 kHz. Other forms of modulated amplitude signal that provide a change with respect to time are considered to be within the scope of the invention such as square waves, sawtooth waves and one or more pulsed electrical signals.

The characteristics of an electrical signal include amplitude, frequency, waveform, phase angle, etc. Therefore, altering an electrical signal may refer to changing at least one of these characteristics.

The electroluminescent devices of the present disclosure generate electromagnetic radiation at wavelengths, more accurately ranges of wavelengths, governed by the emissive properties of the phosphor materials used. In general, light is produced in a region of the electromagnetic spectrum spanning the ultraviolet, visible and near infrared wavelengths. One or more colors of light can be generated in the methods of the present disclosure by deliberate choice of phosphors.

The characteristics of an electromagnetic radiation include amplitude, frequency, waveform, phase angle, polarization, propagation angle, etc. Therefore, a changing electromagnetic radiation may refer to changing at least one of these characteristics.

Electroluminescent light produced in the present methods may be detected by any suitable means and is not limited to any particular mode of detection or visualization. Light produced in the visible portion of the spectrum can be detected by eye, for example. Other means of detecting the emitted light include digital cameras, photographic film, CCD chips, and sensor arrays. Commercial or purpose-built luminometers also can be used to detect and measure the electroluminescence produced in the present methods.

Luminometers having a measurement chamber designed to house a single sample tube such as a Turner Designs TD 20/20 or similar can be used. Alternatively, luminometers designed to receive a 96-well microplate and measure each of the wells can also be used. In some embodiments it may be desirable to select a portion of the wavelengths of light emitted. In such cases the method may further comprise the use of monochromators (prism or grating), or optical filters including low-pass, high-pass and notch or band-pass filters. Optical systems including microscopes using a variety of lenses for optical magnification and selecting a plane of focus can be used in some embodiments.

In some embodiments, the method can be used for measuring a single value of a physical property of an object. For example, an object is brought into proximity to the electroluminescent device as described above, the intensity of the electromagnetic radiation thereby emitted is measured and the intensity is compared to the intensity emitted in the absence of the object. Intensity so measured is related to the property of the object. The intensity can optionally be compared to the intensity emitted in the absence of the object.

In other embodiments, the method can be used for measuring a set or a series of values, i.e. a changing value, of a physical property of an object. In such a method, an object having a changing value of a property is brought into proximity to the electroluminescent device as described above. The intensity of the electromagnetic radiation thereby emitted is measured at fixed or irregular intervals over a period of time and the intensity determined at each time point. The intensities so measured are then related to a changing value of a property of an object. The information to relate the EL radiation to a physical property may be provided in a table or derived from a calibration curve particularly generated for the setup under study. The methods envision cases where the change in property is a continuing process and measurements are made continuously or at intervals as well as cases where the change in property is of a discrete nature, e.g. by measuring different regions of an object or by measuring different samples of an object or by measuring at different times.

In one embodiment there is provided a method for measuring a physical property of an object comprising:

a) transmitting a time-varying electrical signal from a power source to a first terminal of an electroluminescent device, wherein the electroluminescent device remains at open circuit;

b) positioning an object in close proximity to the electroluminescent device while the time-varying electrical signal is transmitted to the electroluminescent device, such that the physical property of the object, or a change thereto, alters the time-varying electrical signal across the electroluminescent device and thereby changes electromagnetic radiation emitted by the electroluminescent device;

c) measuring the change in electromagnetic radiation emitted by the electroluminescent device; and d) relating the measured change in electromagnetic radiation to the changing physical property of the object.

The term alter, as used herein, includes both increases and decreases in the magnitude of the electrical signal. Changes in the emitted electromagnetic radiation includes increases or decreases in intensity as well as changes in frequency or frequency range of the electromagnetic radiation emitted by the electroluminescent device.

In some embodiments, the time-varying electrical signal is transmitted wirelessly. In other embodiments, the time-varying electrical signal is transmitted from the power source to a terminal of the electroluminescent device by a wire or other electrically conductive medium, including metals, other conductive solids, and conductive liquids.

In one embodiment there is provided a method for measuring a physical property of an object comprising:
  a) transmitting a time-varying electrical signal from a power source to an electroluminescent device, wherein the electroluminescent device remains at open circuit;
  b) positioning an object in close proximity to a terminal of the electroluminescent device while the time-varying electrical signal is transmitted to the electroluminescent device, such that a change in the physical property of the object alters the time-varying electrical signal across the electroluminescent device and thereby changes intensity of electromagnetic radiation from the electroluminescent device;
  c) measuring the change in intensity of electromagnetic radiation emitted by the electroluminescent device; and
  d) relating the measured change in intensity of electromagnetic radiation to a physical property of the object.

Example embodiments are provided wherein the physical properties of a contained liquid are investigated. The physical properties are selected from a non-exhaustive list of quantity, height, level, volume, dielectric constant, polarity, and conductivity. A capacitor electrode is used to transmit an electrical signal from an electroluminescent device configured in an open-circuit configuration to the contained liquid. In other embodiments, physical properties of solid and gas materials are investigated.

Capacitor Electrode: A capacitor electrode is defined as an electrode with differential electrical potential across its ends. Analogous to a capacitor whose 'plates' store charges of opposite polarity, i.e., positive and negative, a capacitor electrode holds unequal electrical potentials across its two ends resulting in a non-zero, residual electric field. The presence of this residual electric field will impact the electrical signal propagating along the capacitor electrode. A capacitor electrode can be one dimensional, e.g., wire, two-dimensional, such as a plate, or three-dimensional, i.e., hemispherical shell.

Contained Liquid: A contained liquid refers to a liquid whose physical properties including, but not limited to, volume, height, and dielectric constant are of interest. The liquid is stored in a container and its physical properties are measured. The liquid may be flammable, e.g., gasoline. The liquid may resist, block, or conduct the propagation of electrical signal.

Figure 1B:
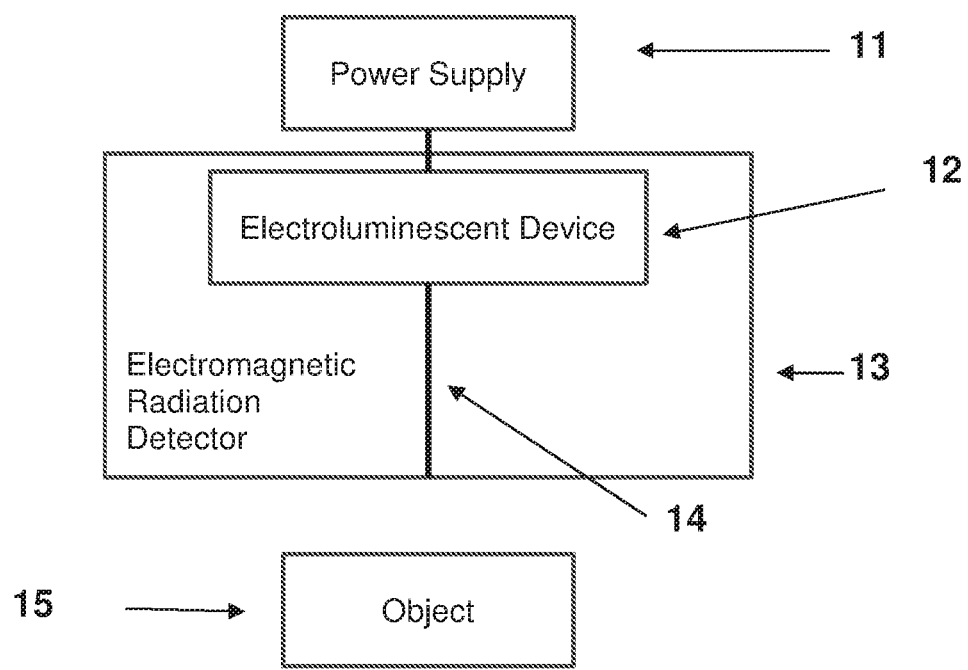
FIG. 1B is a schematic diagram describing an example embodiment of a system for electroluminescence measurement of a contained fluid where an electrical terminal remotely senses the fluid.

Several different configurations of fluid level measurement systems can be devised and all are considered to fall within the scope of the present methods. Example systems of this configuration are provided in FIG. 1A and FIG. 1B. In each configuration, a time-varying electrical signal is transmitted from power source 11 to the electroluminescent device 12 contained within electromagnetic radiation detector 13. In FIG. 1A, the capacitor electrode 14 is in direct contact with the object 15, in this case, gasoline. In FIG. 1B, the object 15 and the capacitor electrode 14 are separated, either by a layer of dielectric material or by a container wall. For example, suitable methods can include those in which:
  1) a sensor is inside the fluid container, alongside the wall going to the bottom of the container,
  2) a remote sensor is outside the container, alongside the wall of the container (a version of this configuration is a modified configuration 1 where the sensor is coated with a dielectric and is inside the container, but not in direct contact with the fluid because of the dielectric,
  3) a remote sensor in which a large plate under the fluid container (a small plate will not give a linear correlation between the fluid level and the signal, rather it distinguishes between different types of fluids,
  4) a container acts as electrode as when the container is a conductive material and is used to measure the level of the fluid inside it,
  5) a container acts as electrode and the container either is insulated but has a conductive shell coating layer that plays the role of the sensor, or the container is conductive, but a layer of dielectric is separating the container from being in direct contact with the fluid.

Voltage Sweeping

In an alternative method instead of monitoring the change of signal for different levels of the fluids at a constant voltage, the input voltage of the power source is adjusted to affect the magnitude of the output time-varying electrical signal until the electroluminescent device emits at a preselected signal intensity. The Voltage value is then correlated to the level of the fluid inside the container. For example, the volume of the fluid samples can be derived from a calibration curve of voltage and fluid volume.

In one embodiment, there is provided a method for measuring a physical property of a contained liquid, the method comprising:
  a) transmitting a time-varying electrical signal from a power source to a first terminal of an electroluminescent device, wherein the electroluminescent device remains at open circuit;
  b) attaching a capacitor electrode to a second terminal of the electroluminescent device, wherein the capacitor electrode is positioned inside and extends vertically alongside a container;
  c) positioning a liquid in close proximity to the capacitor electrode while the time-varying electrical signal is transmitted to the capacitor electrode through the electroluminescent device, such that a change in physical properties of the liquid alters the time-varying electrical signal across the electroluminescent device and thereby changes electromagnetic radiation from the electroluminescent device;
  d) measuring the change in electromagnetic radiation emitted by the electroluminescent device; and
  e) relating the measured change in electromagnetic radiation to a physical property of the liquid.

In another embodiment, there is provided a method for measuring a physical property of a contained liquid, the method comprising:
  a) transmitting a time-varying electrical signal from a power source to a first terminal of an electroluminescent device, wherein the electroluminescent device remains at open circuit;
  b) attaching a capacitor electrode to a second terminal of the electroluminescent device, wherein the capacitor electrode is disposed and extends vertically alongside a container;
  c) positioning a liquid in close proximity to the capacitor electrode while the time-varying electrical signal is transmitted to the capacitor electrode through the electroluminescent device, such that a change in physical properties of the liquid alters the time-varying electrical signal across the electroluminescent device and thereby changes electromagnetic radiation from the electroluminescent device, wherein the capacitor electrode is insulated from the liquid by an insulating material;

d) measuring the change in electromagnetic radiation emitted by the electroluminescent device; and e) relating the measured change in electromagnetic radiation to a physical property of the liquid.

In another embodiment, there is provided a method for measuring a physical property of a contained liquid, the method comprising:

a) transmitting a time-varying electrical signal from a power source to a first terminal of an electroluminescent device, wherein the electroluminescent device remains at open circuit;

b) attaching a capacitor electrode to a second terminal of the electroluminescent device, wherein the capacitor electrode is positioned inside and extends vertically alongside a container;

c) positioning a liquid in close proximity to the capacitor electrode while the time-varying electrical signal is transmitted to the capacitor electrode through the electroluminescent device, such that a change in the electrical signal across the electroluminescent device alters electromagnetic radiation from the electroluminescent device;

d) measuring the change in electromagnetic radiation emitted by the electroluminescent device; and e) relating the measured change in electromagnetic radiation to a physical property of the liquid.

In another embodiment, a conductive container may be used for holding a liquid. There is thus provided a method for measuring a physical property of a contained liquid, the method comprising:

a) transmitting a time-varying electrical signal from a power source to a first terminal of an electroluminescent device, wherein the electroluminescent device remains at open circuit;

b) attaching a conductive container to a second terminal of the electroluminescent device, the conductive container configured to serve as a capacitor electrode;

c) positioning a liquid in close proximity to the conductive container while the time-varying electrical signal is transmitted to the conductive container through the electroluminescent device, such that a change in physical properties of the liquid alters the time-varying electrical signal across the electroluminescent device and thereby changes electromagnetic radiation from the electroluminescent device;

d) measuring the change in electromagnetic radiation emitted by the electroluminescent device; and e) relating the measured change in electromagnetic radiation to a physical property of the liquid.

In another embodiment, a conductive container may be used for holding a liquid wherein the conductive container is insulated from the liquid by an insulating material. There is thus provided a method for measuring a physical property of a contained liquid, the method comprising:

a) transmitting a time-varying electrical signal from a power source to a first terminal of an electroluminescent device, wherein the electroluminescent device remains at open circuit;

b) attaching a conductive container to a second terminal of the electroluminescent device, the conductive container configured to serve as a capacitor electrode;

c) positioning a liquid in close proximity to the conductive container while the time-varying electrical signal is transmitted to the conductive container through the electroluminescent device, such that a change in physical properties of the liquid alters the time-varying electrical signal across the electroluminescent device and thereby changes electromagnetic radiation from the electroluminescent device, wherein the conductive container is insulated from the liquid by an insulating material;

d) measuring the change in electromagnetic radiation emitted by the electroluminescent device; and e) relating the measured change in electromagnetic radiation to a physical property of the liquid.

In another embodiment, a contained liquid level-sensing system comprising a bare capacitor electrode coated with barium titanate and commercial EL particles (30:1 mass ratio) encased inside a water proof glass tube was constructed. The level-sensing system was directly connected to a power source transmitting a time-varying electrical signal and submerged in a water container, in this case, a graduated cylinder. Upon energization, only the part of the level-sensing system contacting the water emitted electromagnetic radiation. In another embodiment, the emitted electromagnetic radiation can be collected and the total emission is therefore related to the contained water level. In this case, the properties of the time-varying electrical signal remain the same between experiments. Therefore, the change in electromagnetic radiation is a function of a change in the number of electroluminescent particles emitting along the liquid level-sensing system as the amount of water inside the container is adjusted.

Contained Solid: A contained solid refers to a solid whose physical properties including, but not limited to, volume, height, and dielectric constant are of interest. The solid is stored in a container and its physical properties are measured. The solid may be one piece or unit such as a slab or block, or it may be a collection of solid pieces, of similar or varying sizes, e.g. powders or granular materials. The solid may resist, block, or conduct the propagation of electrical signal. The present methods may also be used, for example, to assess moisture content, chemical composition, or electrical conductivity of metals.

In another embodiment, there is provided a method for measuring the quantity of a known granular solid in a container, the method comprising:

a) transmitting a time-varying electrical signal from a power source to a first terminal of an electroluminescent device, wherein the electroluminescent device remains at open circuit;

b) attaching a capacitor electrode to a second terminal of the electroluminescent device, wherein the capacitor electrode is positioned inside and extends vertically alongside a container;

c) positioning an unknown quantity of a grain in close proximity to the capacitor electrode while the time-varying electrical signal is transmitted to the capacitor electrode through the electroluminescent device, such that the quantity of the granular solid alters the time-varying electrical signal across the electroluminescent device and thereby changes electromagnetic radiation from the electroluminescent device;

d) measuring the change in electromagnetic radiation emitted by the electroluminescent device; and e) relating the measured change in electromagnetic radiation to the quantity of the granular solid.

Contained Gas: A contained gas is an object in gaseous phase whose physical properties including, but not limited to volume, pressure, temperature, dielectric constant, or moisture content are of interest. The object in a gaseous phase can also refer to a mixture of different gasses whose ratio are to be determined. The gas can also include a vapor of a liquid.

In another embodiment, there is provided a method for measuring the pressure of a known gas in a sealed container, the method comprising:

a) transmitting a time-varying electrical signal from a power source to a first terminal of an electroluminescent device, wherein the electroluminescent device remains at open circuit;

b) attaching a capacitor electrode to a second terminal of the electroluminescent device, wherein the capacitor electrode is positioned inside and extends vertically alongside a sealed container;

c) positioning an unknown quantity of a gas in close proximity to the capacitor electrode while the time-varying electrical signal is transmitted to the capacitor electrode through the electroluminescent device, such that the pressure of the gas alters the time-varying electrical signal across the electroluminescent device and thereby changes electromagnetic radiation from the electroluminescent device;

d) measuring the change in electromagnetic radiation emitted by the electroluminescent device; and e) relating the measured change in electromagnetic radiation to the pressure of the gas.

The present methods can also be coupled to measure a plurality of physical properties of an object. To achieve this, one (or more) electrical signal of known characteristics is transmitted from at least one power supply to one (or more) electroluminescent device. More than one capacitor electrodes are then used to transmit the electrical signal(s) from the electroluminescent device(s) to the contained liquid which may or may not be in direct contact with one or more of the capacitor electrodes. It is required that at least one of the electroluminescent devices remains at open circuit.

In other embodiments of the present disclosure, a property of multiple different objects or multiple quantities of one type of object or substance can be measured. An example of the latter could be measuring each of the wells in a microwell plate. This method can be achieved by transmitting an electrical signal of known characteristics from a power supply to one (or more) electroluminescent device. A capacitor electrode for each well is then used to transmit the electrical signal from the electroluminescent device(s) to the contained liquid which may or may not be in direct contact with one or more of the capacitor electrodes. A separate electroluminescent device, such as an LED with a detector, can be used for each well. Alternately, one LED with one detector could be used for all of the wells and a system used which would only probe one well at a time. In another embodiment, multiple electroluminescent devices are used to generate electromagnetic radiation, wherein the electromagnetic radiation from each of the multiple electroluminescent devices are directed into one detector via electromagnetic wave guides such as fiber optics.

In another representative embodiment, two capacitor electrodes are used to measure two independent properties, e.g. both the type and the quantity, of a liquid sample in a container. Below, an example embodiment is included wherein two capacitor electrodes are used to measure; a first to measure the ethanol content and a second to measure the quantity of gasoline. In one particular embodiment, two independent OCEL methods are positioned in close proximity of gasoline samples of variable quantity and ethanol content. The method is capable of performing two measurements which permit determination of sample volume and ethanol content in gasoline.

This embodiment is illustrative only and is not intended to present a comprehensive list of possible combinations of measuring a plurality of physical properties of an object. For instance, it is not required that the combination of methods used to work independent of one another. Also, it is not required to use more than one power supply, electroluminescent device, or electrode type, i.e., insulated capacitor electrode. Furthermore, the electrical signals generated by the one (or more) power supply may or may not be of identical characteristics, including, but not limited to, amplitude, frequency, waveform, and phase. Lastly, it is not required that all physical properties are measured with electroluminescent methods; this method can be coupled with conventional methods of determining physical properties of an object, e.g., spectroscopy, and can be coupled with "closed-circuit" methods.

In one embodiment, there is provided a method for measuring two physical properties of a contained liquid, the method comprising:

a) transmitting a first time-varying electrical signal from a first power source to a first terminal of a first electroluminescent device, wherein the first electroluminescent device remains at open circuit;

b) transmitting a second time-varying electrical signal from a second power source to a first terminal of a second electroluminescent device;

c) attaching a first capacitor electrode to a second terminal of the first electroluminescent device, wherein the first capacitor electrode is positioned inside and extends vertically alongside a container, wherein the first capacitor electrode may be insulated from the liquid by an insulating material;

d) attaching a second capacitor electrode to a second terminal of the second electroluminescent device, wherein the second capacitor electrode is positioned inside the container, wherein the second capacitor electrode may be insulated from the liquid by an insulating material;

e) positioning a liquid in close proximity to the first capacitor electrode and second capacitor electrode while the first time-varying electrical signal is transmitted to the first capacitor electrode through the first electroluminescent device and the second time-varying electrical signal is transmitted to the second capacitor electrode through the second electroluminescent device, such that a change in physical properties of the liquid alters the first time-varying electrical signal across the first electroluminescent device and the second time-varying electrical signal across the second electroluminescent device and thereby changes electromagnetic radiations from the first electroluminescent device and the second electroluminescent device;

f) measuring the change in electromagnetic radiation emitted by the first electroluminescent device;

g) measuring the change in electromagnetic radiation emitted by the second electroluminescent device; and h) relating the measured changes in electromagnetic radiations to a plurality of physical properties of the liquid.

Another example embodiment is provided to measure both the type and the quantity of an unknown contained liquid. Unknown in this sense can mean the composition of a mixture such as a binary mixture of two liquids of unknown proportion. Another example can be the unknown concentration of a solute in a solution.

In a particular embodiment described more fully in the examples, the types of gasoline samples of variable quantity and ethanol content are determined by isolating and independently characterizing a sample of known volume from the remainder of the contained liquid. Knowledge of the type of the contained liquid will facilitate an accurate determination of its quantity. The following embodiment can be coupled with other methods covered in the present disclosure or other conventional methods to measure a plurality of physical properties of an object.

In one embodiment, there is provided a method for measuring a physical property of a contained liquid, the method comprising:

a) transmitting a time-varying electrical signal from a power source to a first terminal of an electroluminescent device, wherein the electroluminescent device remains at open circuit;

b) attaching a capacitor electrode to a second terminal of the electroluminescent device, wherein the capacitor electrode is positioned inside and extends vertically alongside a container;

c) positioning a liquid of known volume in close proximity to the capacitor electrode while the time-varying electrical signal is transmitted to the capacitor electrode through the electroluminescent device, such that the type or physical property of the known volume of liquid alters the first time-varying electrical signal across the electroluminescent device and changes the electromagnetic radiation from the electroluminescent device;

d) measuring the change in electromagnetic radiation emitted by the electroluminescent device; and e) relating the measured change in electromagnetic radiation to a physical property of the liquid.

Applicants have discovered that the range and scope of measurements using OCEL technology can be further expanded using an additional circuit component.

Figure 2A:
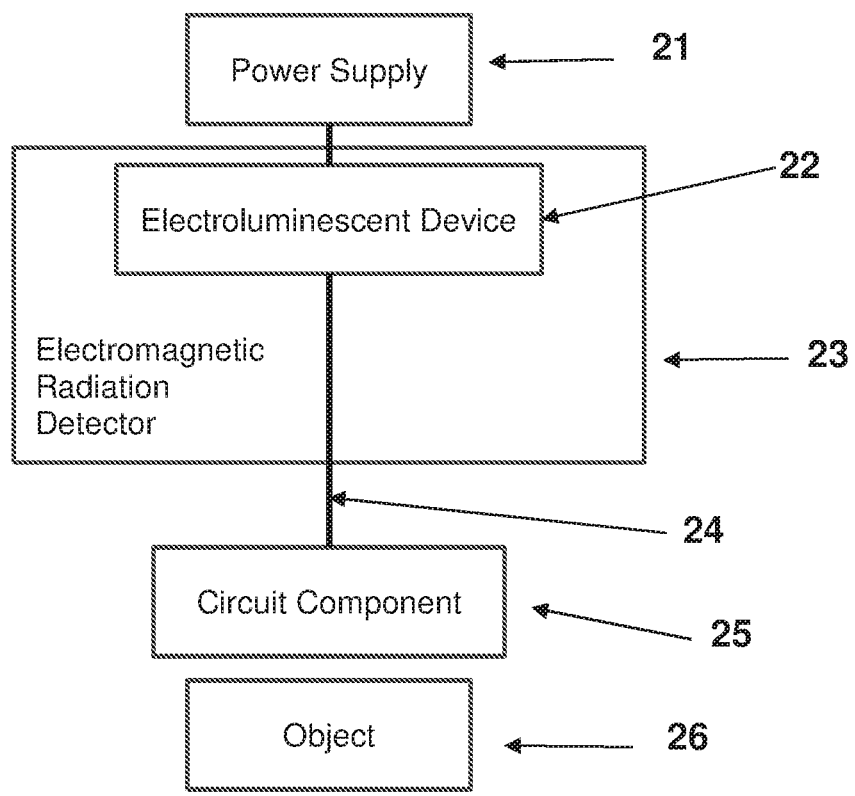
FIG. 2A is a schematic diagram describing an example embodiment of a system for electroluminescence measurement of an object where a circuit component is in direct contact with the object.
Figure 2B:
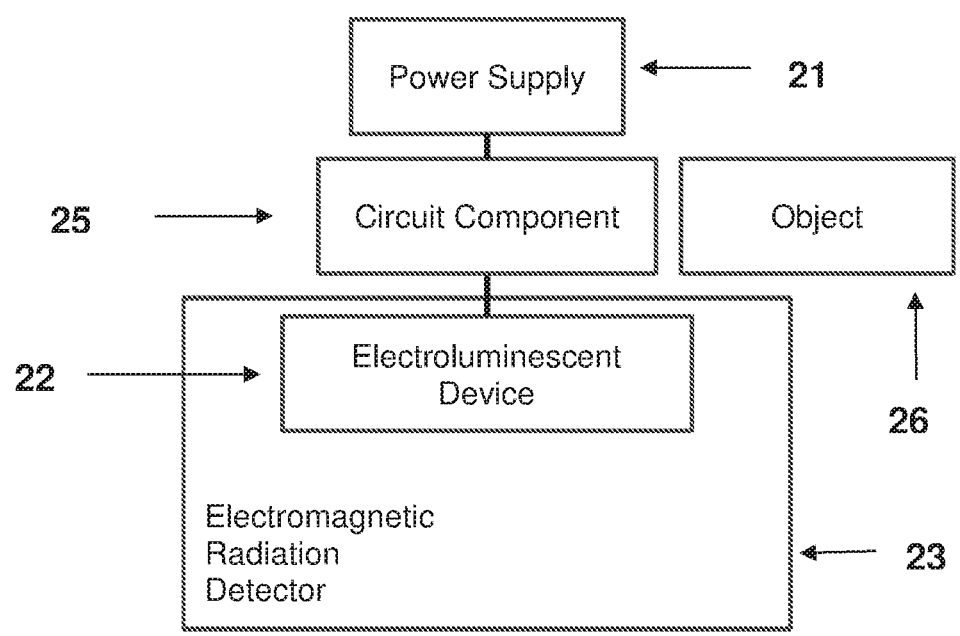
FIG. 2B is a schematic diagram describing an example embodiment of a system for electroluminescence measurement of an object where a circuit component remotely senses the object.

In one embodiment, the object can be a circuit component, wherein a physical property of the circuit component can be changed. Example systems of this configuration are shown in FIGS. 2A and 2B. In FIG. 2A, the object 26 is positioned in close proximity to a circuit component 25 by a wire 24 that is connected to the electroluminescent device 22 contained within electromagnetic radiation detector 23. In FIG. 2B, the circuit component 25 is between the power source 21 and the electroluminescent device 22. The change in the physical property of the circuit component can alter the time-varying electrical signal across the electroluminescent device with which the circuit component is coupled causing the electromagnetic radiation emitted by the electroluminescent device to change. The change the electromagnetic radiation of the electroluminescent device is then measured and related to the physical property of the circuit component.

The circuit component is selected based on the types of physical properties to which the circuit component is receptive. For instance, an inductor may be used to measure magnetic properties of an object, i.e., to determine the extent to magnetic properties of an object affects the characteristics of the electrical signal through the inductor. The order in which the electroluminescent device and the circuit component(s) are attached can vary. The electroluminescent device and the circuit component(s) can be coupled in series or parallel configuration.

Additional circuit components are selected, without limitation, from a list of inductors, solenoids, transformers, electromagnetic radiation sensors such as photodiodes and thermopiles, thermocouples, and thermoelectric sensors, and piezoelectric sensors. These components are coupled with the present disclosure to broaden the types of measurable physical properties. In the following embodiments, an object is positioned in close proximity to a circuit component that is coupled to the OCEL methods discussed in the present disclosure. The changes to physical properties of the object will alter the characteristics of the electrical signal propagating through the circuit component and thus across the electroluminescent device.

Additional circuit components can be employed in a method for measuring one or more properties of an object. The component is configured to be in electrical communication with the electroluminescent device and to exhibit an effect on the electrical signal being experienced by the electroluminescent device. Such components can be interposed between the power supply and the electroluminescent device or can be disposed so that the electroluminescent device is between the power supply the additional circuit component. In either arrangement the electroluminescent device remains at open-circuit.

Inductor: In some embodiments, an inductor is used to cause a change in electrical signal across an electroluminescent device. An inductor is defined as a coil, choke, or reactor. An inductor is a circuit component and is commonly a two-terminal electrical component that stores energy in a magnetic field when an electric current flows through it. An inductor typically comprises an insulated wire wound into a coil. In other embodiments, the term inductor is used to refer to a wire wound into a coil around a core. Properties/objects measurable by use of an inductor include displacement, distance, position, orientation, oscillation, vibrations, composition, volume, surface area, length, and conductivity.

In one experiment, an inductor comprising a wire wound into a coil around a core with two terminals was operably coupled to an electroluminescent device with a first terminal receiving time-varying electrical signal from a power supply and a second terminal. The two terminals of the inductor were directly connected to the second terminal of the EL device. The coupled inductor received the time-varying electrical signal. A metal piece was placed in known distance of 0.1 mm from the surface of the inductor which resulted in a change in EL device electromagnetic radiation (from 0 RLUs to 13,000 RLUs, RLU=relative light unit). Increasing the distance between the metal piece and the inductor resulted in incremental reductions in electromagnetic radiation (from 13,000 to 10,400 RLUs for distances 0.1-1.4 mm, respectively). A digital caliper with resolution 0.01 mm was used to measure distances. For 0.01 mm change in distance, there was 60 RLUs change in electromagnetic radiation intensity measured.

In another experiment, an inductor comprising a wire wound into a coil around a core with two terminals was operably coupled to an electroluminescent device with a first terminal receiving time-varying electrical signal from a power supply and a second terminal. The two terminals of the inductor were directly connected to the second terminal of the EL device. The coupled inductor received the time-varying electrical signal. An electromagnet was placed in close proximity (1 cm) to the inductor. A metal piece was placed on top of the inductor, between the inductor and the electromagnet, which resulted in a change in EL device electromagnetic radiation (from 1,850 RLUs to 2,000 RLUs). The electromagnet was connected to a power supply. Once energized, the electromagnet was capable of attracting the metal piece and separating it from the inductor surface. Increasing the distance between the metal piece and the inductor resulted in a reduction in electromagnetic radiation (from 2,000 to 1,850 RLUs). The power supply connected to the electromagnet was set to generate square waves of 200 and 500 mHz during which the electromagnet was periodically energized. The change in electromagnetic radiation was in phase with the change in the energization of the electromagnet and, therefore, the position of the metal piece. The resolution of the measurements is set by the resolution of the electromagnetic radiation detector.

In another experiment, an inductor comprising a wire wound into a coil around a core with two terminals was operably coupled to an electroluminescent device with a first terminal receiving time-varying electrical signal from a power supply and a second terminal. The two terminals of the inductor were directly connected to the second terminal of the EL device. The coupled inductor received the time-varying electrical signal. A wheel supporting four metal pieces organized in a predetermined manner. The wheel and the supported metal pieces were placed in a known distance from the surface of the inductor. Each metal piece caused a change in EL device electromagnetic radiation depending on the type and or its position on the wheel relative to the inductor. The electromagnetic radiation for each of the four metal pieces was determined (metal 1: 4170 RLUs, metal 2: 4110 RLUs, metal 3: 4100 RLUs, and metal 4: 4070 RLUs). Then the wheel is manually rotated around its axis. The period of the angular rotation was determined based on the change in electromagnetic radiation due to the four metal pieces. The resolution of measurement is a function of the number of unique combinations of metals pieces. Having knowledge of the radius of the wheel allowed the angular speed of the wheel to be indicated. In addition, the angle at which the wheel stopped was derived from the electromagnetic radiation data.

In one embodiment, there is provided a method for non-contact measurement of a property of an object, the method comprising:

a) transmitting a time-varying electrical signal from a power source to a first terminal of an electroluminescent device, wherein the electroluminescent device remains at open circuit;

b) Attaching terminals of an inductor to a second terminal of the electroluminescent device;

c) positioning an object in close proximity to the inductor while the time-varying electrical signal is transmitted to the inductor through the electroluminescent device, such that a change in physical properties of the object alters the time-varying electrical signal across the inductor and the electroluminescent device and thereby changes electromagnetic radiation from the electroluminescent device;

d) measuring the change in electromagnetic radiation emitted by the electroluminescent device; and e) relating the measured change in electromagnetic radiation to a physical property of the object.

In another embodiment, there is provided a method for non-contact measurement of displacement, distance, position, orientation, oscillation, vibrations, composition, volume, surface area, length, and conductivity of an object, the method comprising:

a) transmitting a time-varying electrical signal from a power source to a first terminal of an inductor, b) attaching an electroluminescent device to a second terminal of the inductor, c) positioning an object in close proximity to the inductor while the time-varying electrical signal is transmitted to the inductor and to the electroluminescent device, such that a change in physical properties of the object varies the time-varying electrical signal across the inductor and the electroluminescent device and thereby changes electromagnetic radiation from the electroluminescent device;

d) measuring the change in electromagnetic radiation emitted by the electroluminescent device; and e) relating the measured change in electromagnetic radiation to a physical property of the object.

In some embodiments, the physical characteristics of a circuit component can be manipulated. For instance, physical characteristics of an inductor's core can be changed. In the following embodiment, the object whose properties change the electrical signal across the electroluminescent device is considered the core on the inductor. In this particular embodiment, the inductor is comprised of a coil wound around a container. Different quantities of a liquid are added to the container which causes a change in the electrical signal across an electroluminescent device. The change in the electromagnetic radiation is related to the quantity of the liquid.

In one experiment, an inductor comprising a wire wound into a coil around a core with two terminals was operably coupled to an electroluminescent device with a first terminal receiving time-varying electrical signal from a power supply and a second terminal. The two terminals of the inductor were directly connected to the second terminal of the EL device. The coupled inductor received the time-varying electrical signal. A dirt pile was placed in known distance of 0.1 mm from the surface of the inductor which resulted in a change in EL device electromagnetic radiation (from 6,220 RLUs to 6,620 RLUs). Increasing the moisture content of the dirt pile resulted in incremental enhancements in electromagnetic radiation. For instance, the electromagnetic radiation of the electroluminescent device increased from 6,220 RLUs to 6,820 RLUs for the addition of 1 mL of water to the dirt pile. The electromagnetic radiation was smaller for smaller additions of water (e.g., 20 RLUs increase in electromagnetic radiation for 100 uL of water). The applicant envisions a sensor to measure the moisture content of products such as grains and objects such as dirt for farming applications.

In one embodiment, there is provided a method for measuring a quantity of a known contained liquid, the method comprising:

a) transmitting a time-varying electrical signal from a power source to a first terminal of an electroluminescent device, wherein the electroluminescent device remains at open circuit;

b) attaching terminals of an inductor to a second terminal of the electroluminescent device, wherein the inductor comprises a coil wound around a container;

c) positioning a known liquid in close proximity to the inductor while the time-varying electrical signal is transmitted to the inductor through the electroluminescent device, such that a change in physical properties of the object varies the time-varying electrical signal across the inductor and the electroluminescent device and thereby changes electromagnetic radiation from the electroluminescent device;

d) measuring the change in electromagnetic radiation emitted by the electroluminescent device; and e) relating the measured change in electromagnetic radiation to a physical property of the known liquid.

Spring Electrode: A spring electrode is similar to a solenoid and is a coil wound into a tightly packed helix. Compared to a solenoid, a spring electrode is flexible. The flexibility of a spring electrode is linked to its stiffness constant factor. The forces impacting an object attached to a spring electrode displace the spring electrode. Based on Hooke's Law, the spring electrode's displacement is a function of its stiffness constant factor and the forces.

Properties/objects measurable by use of a spring electrode include displacement, weight, and acceleration.

In one experiment, a spring electrode (a solenoid) comprising a wire wound into a coil with two terminals was operably coupled to an electroluminescent device with a first terminal receiving time-varying electrical signal from a power supply and a second terminal. One terminal of the spring electrode was directly connected to the second terminal of the EL device. The coupled spring electrode received the time-varying electrical signal. The second terminal of the spring electrode was connected to a stationary mass of 200 grams. At this point, the electromagnetic radiation of the electroluminescent device was measured at 7,700 RLUs. Once the mass was released the spring was stretched. The change in the length of the spring electrode resulted in a change in the electromagnetic radiation of the electroluminescent device. The oscillation and the time constant of damping of the oscillations were determined from the change in electromagnetic radiation. The electromagnetic radiation for when the spring electrode was at equilibrium and stationary (i.e., maximum stretching due to a mass of 200 grams) was measured at 8,400 RLUs. The experiment was done for various masses during which the change in electromagnetic radiation for individual test masses were recorded.

In another experiment, four spring electrodes were used with the objective to determine the location of a lever on a two-dimensional screen. To achieve this, for spring electrodes were connected to a lever on one end and to a conductive pin at each corner of a rectangular screen of dimensions 6"×12". The lever was moved horizontally within the rectangular screen. The change in the location of the lever on the screen caused the four spring electrodes to displace (i.e., stretch) differently. The location of the lever was then determined by connecting the electroluminescent device to each of the conductive pins and measuring the extent to which each of the four spring electrodes was stretched. The applicant envisions a sensor, such as a gyroscope, to measure the location of a test mass attached to a plurality of spring electrodes organized in a predetermined format, in order to determine the orientation, oscillation, motion, etc. of the sensor.

In another embodiment, there is provided a method for measurement of displacement, weight, and acceleration of an object, comprising:

a) transmitting a time-varying electrical signal from a power source to a first terminal of an electroluminescent device, b) attaching a spring electrode to a counter-terminal of the electroluminescent device, c) positioning an object in close proximity to the spring electrode while the time-varying electrical signal is transmitted to the electroluminescent device, such that a change in physical properties of the object varies the time-varying electrical signal across the spring electrode and the electroluminescent device and thereby changes electromagnetic radiation from the electroluminescent device;

d) measuring the change in electromagnetic radiation emitted by the electroluminescent device; and e) relating the measured change in electromagnetic radiation to a physical property of the object.

In other embodiments, circuit components such as thermocouple electrodes, electromagnetic radiation detectors, and piezoelectric sensors can be used in a method to detect a property of an object wherein the property can be selected from a non-exhaustive list of environmental conditions such as temperature, pressure, electromagnetic radiation, and vibration.

Thermocouple: A thermocouple comprises a pair of non-identical conductive electrodes with different thermal conductivity properties. A residual electric potential difference forms between the two dissimilar electrodes due to the thermoelectric effect. This residual electric potential can impact the electrical signal propagating through a thermocouple. The magnitude of the residual potential difference is a function of temperature.

In one embodiment, a thermocouple is attached to a second terminal of an electroluminescent device of an OCEL system. The temperature of the environment surrounding the thermocouple is manipulated with the use of a heat gun. An electrical current is generated inside the thermocouple when the temperature changes. The generated electrical current causes a change in electromagnetic radiation of the electroluminescent device. The change in electromagnetic radiation is then related to the amount of change in the temperature of thermocouple.

In one experiment, a thermocouple comprising a pair of metal wires of different physical properties was operably coupled to an electroluminescent device with a first terminal receiving time-varying electrical signal from a power supply and a second terminal. The pair of wires of the thermocouple were directly connected to the second terminal of the EL device. The coupled pair of wires of the thermocouple received the time-varying electrical signal. The pair of wires of the thermocouple was then placed in close proximity to a heat gun which resulted in rising temperature of the pair of wires of the thermocouple. The change in temperature and the resulting change in electromagnetic radiation were recorded. In one experiment, the electromagnetic radiation dropped from 8000 RLUs to 7300 RLUs as temperature of the pair of wires of the thermocouple changed from 45 to 70 degrees C., respectively.

In one embodiment, there is provided a method for measuring temperature of an object, comprising:

a) transmitting a time-varying electrical signal from a power source to a first terminal of an electroluminescent device, wherein the electroluminescent device remains at open circuit;

b) attaching a pair of thermocouple electrodes to a second terminal of the electroluminescent device;

c) positioning an object in close proximity to the pair of thermocouple electrodes while the time-varying electrical signal is transmitted to the electroluminescent device, such that a change in physical properties of the object varies the time-varying electrical signal across the pair of thermocouple electrodes and the electroluminescent device and thereby changes electromagnetic radiation from the electroluminescent device;

d) measuring the change in electromagnetic radiation emitted by the electroluminescent device; and e) relating the measured change in electromagnetic radiation to a physical property of the object.

Electromagnetic Radiation Sensor: in some embodiments, electromagnetic radiation sensors including but not limited to photosensors and thermopiles. The incoming electromagnetic radiation will cause a small current to flow through the sensor that can be harvested and turned into measurable signal. This phenomenon is known as 'photoelectric effect.'

In one experiment, a thermopile comprising a plurality of terminals was operably coupled to an electroluminescent device with a first terminal receiving time-varying electrical signal from a power supply and a second terminal. Two terminals of the thermopile were directly connected to the second terminal of the EL device. The coupled thermopile received the time-varying electrical signal. The thermopile was then exposed to a source of thermal energy emitting infrared radiation. The background electromagnetic radiation was recorded at 7,800 RLUs. Once the infrared radiation source was turned on, the electromagnetic radiation of the electroluminescent device slowly increased to 9,200 RLUs within 25 seconds. Once the infrared radiation source was turned off, the electromagnetic radiation slowly returned to its original electromagnetic radiation values of 7,800 RLUs within 150 seconds.

In another experiment, a photodiode comprising a plurality of terminals was operably coupled to an electroluminescent device with a first terminal receiving time-varying electrical signal from a power supply and a second terminal. Two terminals of the photodiode were directly connected to the second terminal of the EL device. The coupled photodiode received the time-varying electrical signal. The thermopile was then exposed to a flash light. The background electromagnetic radiation was recorded at 8,000 RLUs. Once the flash light was turned on to 'dim', the electromagnetic radiation of the electroluminescent device immediately increased to 8,170 RLUs. The electromagnetic radiation of the electroluminescent device enhanced to 8,250 when the flash light became brighter. Moreover, when the flash light was set to generate blinking electromagnetic radiation, i.e., on and off at a certain frequency, the electromagnetic radiation of the electroluminescent device modulated between 8,000 and 8,200 RLUs at 10 Hz, suggesting the frequency at which the flash light jumped between 'off' and 'somewhat bright' statuses.

In another embodiment, there is provided a method for measuring physical properties of electromagnetic radiation of an object, comprising:

a) transmitting a time-varying electrical signal from a power source to a first terminal of an electroluminescent device, wherein the electroluminescent device remains at open circuit;

b) attaching terminals of an electromagnetic radiation sensor to a second terminal of the electroluminescent device;

c) positioning an object in close proximity to the electromagnetic radiation sensor while the time-varying electrical signal is transmitted to the electroluminescent device, such that a change in physical properties of the object varies the time-varying electrical signal across the electromagnetic radiation sensor and the electroluminescent device and thereby changes electromagnetic radiation from the electroluminescent device;

d) measuring the change in electromagnetic radiation emitted by the electroluminescent device; and e) relating the measured change in electromagnetic radiation to a physical property of the object.

Piezoelectric Sensor: Piezoelectric sensor is hereby defined as a sensor that converts mechanical energy into electrical energy using the so called 'piezoelectric effect.' Mechanical energy can be in the form of acceleration, pressure, temperature, vibration, oscillation, strain, or force.

In one experiment, a piezoelectric sensor comprising a plurality of terminals was operably coupled to an electroluminescent device with a first terminal receiving time-varying electrical signal from a power supply and a second terminal. Two terminals of the piezoelectric sensor were directly connected to the second terminal of the EL device. The coupled piezoelectric sensor received the time-varying electrical signal. The piezoelectric sensor was then exposed to a source of mechanical energy. The mechanical energy was provided by a dielectric auxiliary rod. The background electromagnetic radiation was recorded at 12,760 RLUs. Due to impact from the auxiliary rod, the piezoelectric sensor is deflected resulting in the electromagnetic radiation of the electroluminescent device to decrease to 12,660 RLUs. More impactful events resulted in larger changes in electromagnetic radiation of the electroluminescent device. For instance, the electroluminescent radiation decreased to 12,525 RLUs when the impact caused the piezoelectric sensor to deflect up to nearly 90 degrees from it original position.

In another embodiment, there is provided a method for measurement of a property selected from the group consisting of vibration, deflection, displacement, and oscillation of an object, the method comprising:

a) transmitting a time-varying electrical signal from a power source to a first terminal of an electroluminescent device, wherein the electroluminescent device remains at open circuit;

b) attaching terminals of a piezoelectric sensor to a second terminal of the electroluminescent device, c) positioning an object in close proximity to the piezoelectric sensor while the time-varying electrical signal is transmitted to the electroluminescent device, such that a change in the physical property of the object alters the time-varying electrical signal across the piezoelectric sensor and the electroluminescent device and thereby changes electromagnetic radiation from the electroluminescent device;

d) measuring the change in electromagnetic radiation emitted by the electroluminescent device; and e) relating the measured change in electromagnetic radiation to the physical property of the object.

Transformer: In some embodiments of the present disclosure, the electrical signal from the power supply can be transmitted to a primary coil of a transformer comprising two coils. The secondary coil of the transformer can then be used as a receiver. In the following embodiment, the electroluminescent device is attached to a coil which receives the electrical signal transmitted by a primary coil that is attached to a power supply.

In some embodiments, two insulated coils (the primary and the secondary coils) are coupled such that a time-varying electrical signal can be transferred between the two coils. The primary and the secondary coils are coupled such that the electrical signal from the power supply can be transferred between the coils wirelessly. In this case, the time-varying electrical signal in the primary coil will induce a time-varying electrical signal in the secondary coil.

Figure 3:
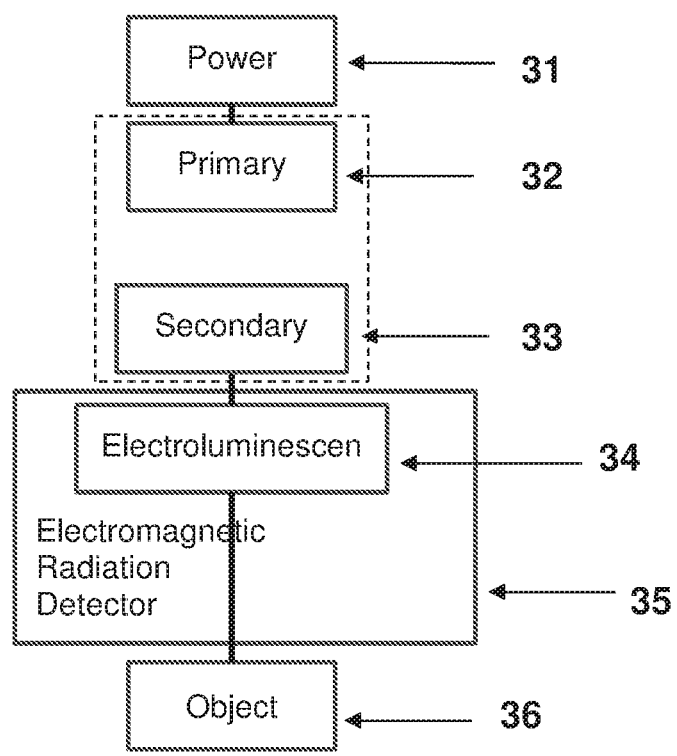
FIG. 3 is a schematic diagram describing an example embodiment of a system for electroluminescence measurement of an object using a transformer.

In one experiment, a transformer comprising a primary and a secondary coils were operably coupled to an electroluminescent device. An example teaching of this configuration is shown in FIG. 3. The primary coil 32 of the transformer was connected to a power supply 31. The secondary coil 33 of the transformer was operably coupled with the first coil. A first terminal of an electroluminescent device 34 was connected to the secondary coil and thus received a time-varying electrical signal from the system of the power supply and the transmitting primary transformer coil. Electroluminescent device 34 is housed in a detection zone of 35 and placed in close proximity to object 36. In another experiment, the primary and the secondary transformer coils were placed around a microtiter well. The background electromagnetic radiation of the electroluminescent device was recorded at 9,750 RLUs. Adding droplets of water inside the microtiter well resulted in a change in the electromagnetic radiation of the electroluminescent device.

Each additional water droplet caused an increase in the electromagnetic radiation of the electroluminescent device by 25 RLUs.

In one embodiment, there is provided a method for measuring a physical property of an object wherein a time-varying electrical signal is wirelessly transmitted to an electroluminescent device, comprising:

a) transmitting a time-varying electrical signal from a power source to a primary coil;

b) coupling a secondary coil to the primary coil, such that the time-varying electrical signal in the primary coil induces a time-varying signal in the secondary coil;

c) attaching the secondary coil to a first terminal of an electroluminescent device, wherein the electroluminescent device remains at open circuit;

d) positioning an object in close proximity to the electroluminescent device while the time-varying electrical signal is transmitted to the electroluminescent device, such that a change in physical properties of the object alters the time-varying electrical signal across the electroluminescent device and thereby changes electromagnetic radiation from the electroluminescent device;

e) measuring the change in electromagnetic radiation emitted by the electroluminescent device; and f) relating the measured change in electromagnetic radiation to a physical property of the object.

In some embodiments, the secondary coil is attached to a first terminal of an electroluminescent device. In other embodiments, a transformer comprises a core around which both the primary and secondary coils are wound. Changing the properties of the core can cause a change in the electrical signal, and therefore, a change in electromagnetic radiation of an electroluminescent device. In the following embodiment, the object whose properties change the electrical signal across the electroluminescent device is considered the core on the transformer. In this particular embodiment, the transformer is comprised of a primary coil and a secondary coil wherein at least one of the coils is wound around a container. Different quantities of a liquid are added to the container which causes a change in the electrical signal across an electroluminescent device. The change in the electromagnetic radiation is related to the quantity of the liquid.

In one embodiment, there is provided a method for measuring the quantity of a known liquid, comprising:

a) transmitting a time-varying electrical signal from a power source to a primary coil;

b) coupling a secondary coil to the primary coil, such that the time-varying electrical signal in the primary coil induces a time-varying signal in the secondary coil, wherein the primary coil wound around a container;

c) attaching the secondary coil to a first terminal of an electroluminescent device, wherein the electroluminescent device remains at open circuit;

d) positioning an object in close proximity to the primary coil while the time-varying electrical signal is transmitted to the secondary coil and to the electroluminescent device, such that a change in physical properties of the object alters the time-varying electrical signal across the secondary coil and the electroluminescent device and thereby changes electromagnetic radiation from the electroluminescent device;

e) measuring the change in electromagnetic radiation emitted by the electroluminescent device; and f) relating the measured change in electromagnetic radiation to the quantity of the known liquid.

The disclosed method further allows for measuring a physical property of an object using multiple techniques. The techniques will include at least one OCEL method. In one embodiment, the volume of a contained liquid inside a container of known dimensions is measured via:

1) a capacitive electrode, wherein the capacitive electrode is installed inside and extended along the body of the container, 2) an inductor, wherein the inductor is mounted below the container and electrically insulated from the liquid, and 3) an ultrasonic level indicator, the ultrasonic level controller installed over the container lid and is configured to actively transmit ultrasonic signal and to measure the reflected signal to determine the liquid height.

The three techniques report estimated volume of the contained liquid independently. The three independent measurements can then be cross-calibrated and compared for improved measurement accuracy. In some embodiments, the independent techniques can further identify the quality of the contained liquid. This information can then be used to derive the volume of the contained liquid. In some other embodiments, the shape, i.e., dimensions, of the container is predetermined.

Electrochemical Cell: An electrochemical cell refers to a device for generating electricity via chemical reactions. A device that uses electricity to cause chemical reaction is also an electrochemical cell. One example of an electrochemical cell includes a battery comprising of a plurality of half cells. A battery is a device consisting of one or more electrochemical cells with external connections provided to power electrical devices. To power devices a redox reaction inside a connected battery converts high-energy reactants to lower-energy products. The free energy difference is provided to the device as an electrical current.

In one embodiment, the OCEL system is used to determine the rate at which electricity is generated by a chemical reaction. In the embodiment, an electrical current formed between two half cells of an electrochemical cell is measured by the amount of change the electrical current causes across an electroluminescent device connected to a source of time-varying electrical signal. In another embodiment, a capacitive electrode is used to measure the stored electrical charge inside an electrochemical cell, i.e., a battery.

In one embodiment, a capacitor of an unknown stored charge is brought in close proximity of an OCEL system. The change in electromagnetic radiation of the OCEL system's EL device is then related to the stored amount of charge inside the capacitor.

Example embodiments will now be described more fully with reference to the following examples and accompanying drawings.

Example 1

A high-frequency (35 kHz) CCFL circuit with adjustable input voltage was used to demonstrate the response-luminance profile of a red LED. CCFL circuit CXA-M10M-06Y15R was powered by a wave generator (BK Precision 4052). The system configuration of the CCFL circuit connected directly to an LED (Mouser P/N: 638-MV8113) in an open-circuit format and measured using a luminometer (TD-20/20, Turner Designs) as previously described in Applicant's U.S. patent application Ser. No. 16/027,421. In this example, the substance or material that alters the electric field across the LED is a wire of unknown properties. With this system, modulating DC input voltage enabled monitoring changes in the properties of the material or substance that alters the electric field across the EL device over time. Unless specified otherwise, the system described in this example was incorporated in the following worked examples.

Example 2: (Direct-Remote-Container as Sensor)

The apparatus of example 1 was used in a fluid-level sensing method. A second terminal of the electroluminescent device (LED) was connected to a wire, and the wire was fixed inside a container, alongside the inner wall of the container. With increasing the level of the fluid inside the container, the signal of the electroluminescent device increased, which was recorded by a photosensor. In another example, the wire was connected to the second terminal of the electroluminescent device, and was fixed outside of the container alongside the wall of the container (remote sensing). Changing the fluid inside the container altered the signal of the electroluminescent device. In yet another example, the container was a conductive body. The second terminal of the electroluminescent device was connected to the container and the container served as the sensor.

Figure 4:
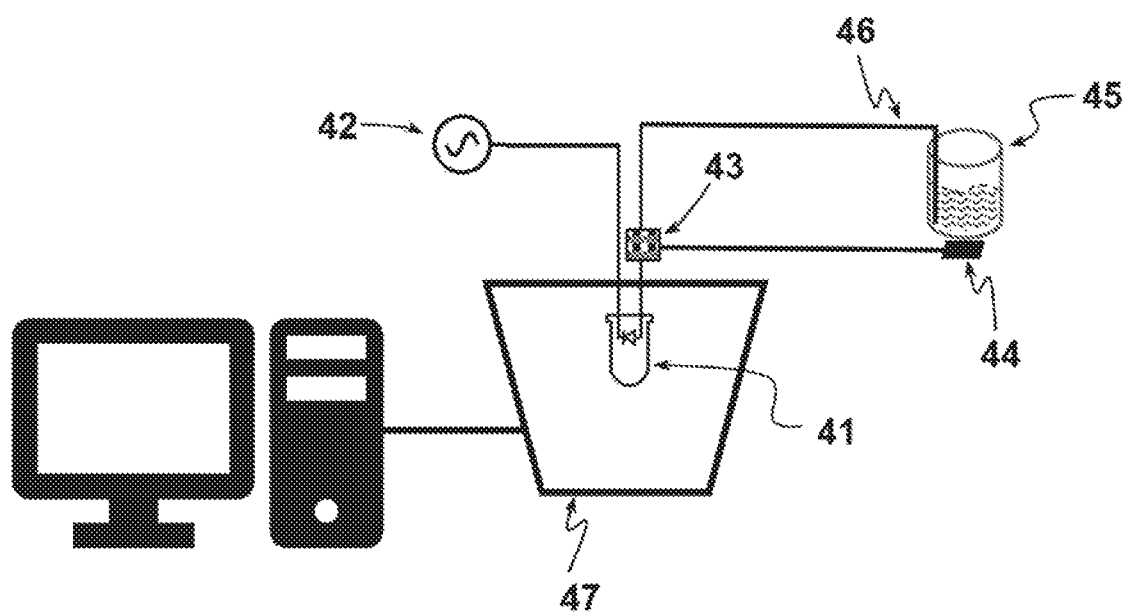
FIG. 4 is a diagram describing an example embodiment of a system for electroluminescence measurement of both the type and quantity of an unknown liquid.

Example 3: (Measuring Plurality of Properties with Different Methods) with Reference to FIG. 4

This example demonstrates both the type and quantity of an unknown liquid being measured. In this example the electroluminescent device was an LED 41. The first terminal of the electroluminescent device was connected to the power source 42 via a time-varying electrical signal transmitting terminal. The second terminal of the LED was connected to a switch 43, with two switchable output terminals. One output terminal was connected to a small plate 44 (type sensor) which was placed under a container 45. The second output terminal was a wire 46 (volume sensor) that was fixed inside the container, alongside the inner wall of the container. A photosensor 47 recorded the magnitude of the electromagnetic radiation from the electroluminescent device. With changing the fluid inside the container, the signal of the type sensor reached a plateau value which was related to the type of the fluid inside the container (Table 1). The signal of the volume sensor indicated the quantity of the fluid. (Table 2).

In another example, instead of having a switch, two electroluminescent devices were separately used for the type sensor and the volume sensor.

Other examples are presented for measuring a plurality of properties. In an example experiment, a fixed quantity of the sample was separated from the bulk of a fluid with unknown type and quantity. The signal of the electroluminescent device for the fixed quantity of the sample indicated the type of fluid, and the signal of the electroluminescent device for the bulk of the fluid determines the quantity of the sample.

Table 1 with reference to example 2: Data of two sensor/ two property tabulated.

TABLE 1

| | | Type Sensor | | |
|---|---|---|---|---|
| Sample | Trial # | Signal (RLUs) | Averafe Signal (RLUs) | RSD (%) |
| Ethanol free gasoline | 1 | 3885.5 | 3922 | 2.37 |
| | 2 | 3894.5 | | |
| | 3 | 3951.5 | | |
| | 4 | 3878.5 | | |
| | 5 | 4000 | | |

TABLE 1-continued

| | | Type Sensor | | |
|---|---|---|---|---|
| Sample | Trial # | Signal (RLUs) | Averafe Signal (RLUs) | RSD (%) |
| Gasoline + 10% ethanol | 1 | 4706 | 4579 | 1.14 |
| | 2 | 4599 | | |
| | 3 | 4508.5 | | |
| | 4 | 4614 | | |
| | 5 | 4470 | | |

Table 2 with reference to example 2: Data of two sensor/ two property tabulated.

TABLE 2

| | | Volume Sensor | | |
|---|---|---|---|---|
| Sample | Volume (mL) | Signal (RLUs) | Signal = f(volume) | Regression |
| Ethanol free gasoline | 100 | 1388 | Y = 9.736X + 406.6 | 0.999 |
| | 200 | 2355 | | |
| | 300 | 3296 | | |
| | 400 | 4329 | | |
| | 500 | 5269 | | |
| Gasoline + 10% ethanol | 100 | 2314 | Y = 18.759X + 473.3 | 0.999 |
| | 200 | 4266 | | |
| | 300 | 6117 | | |
| | 400 | 7963 | | |
| | 500 | 9845 | | |

The information to relate the EL radiation to a physical property may be provided in a table or derived from a calibration curve particularly generated for the setup under study.

In another example, the objective was to distinguish metallic rivets of the same volume based on their type. To achieve this, the first terminal of an electroluminescent device was connected to a time-varying electrical signal supply, and the second terminal of the electroluminescent device was connected to a sensor that is a conductive surface (ITO glass). The response of the electroluminescent device was recorded by a photosensor, for each sample. The sample included an aluminum rivet, steel rivet, and a rivet of unknown type. The output value of the electroluminescent device indicates the type of the tested metal. The order of electromagnetic radiation intensity, the signals, from the largest to the smallest, for the three rivets were: 1) Steel (400 RLUs), 2) Aluminium (350 RLUs), and 3) the unknown (100 RLUs). The measurements further indicated that the unknown rivet was neither steel or aluminum. The applicant envisions an object sorting machine that uses the above-mentioned setup.

In a similar experiment, the samples include different volumes (mass) of metal rivets of the same type. By changing the number of metallic rivets positioned in close proximity to the sensor the total volume of the sample on the sensor changes. The change in sensor results in a change in the output electromagnetic radiation. The change in output electromagnetic radiation was then related to the number of the rivets.

Example 5 (Gas Phase)

In another example, the type of different material in gas phase is measured using an open-circuit electroluminescent device. In this example, the first terminal of the electroluminescent device is connected to a time-varying electrical signal supply. The second terminal of the electroluminescent device is connected to the wire, and the wire is in a container in the overhead space of a mixture of two solvents with different boiling points. A heater is bringing the solvents to the boiling point, with the solvent with lower boiling point starting to boil and fill the overhead space. The electroluminescent device detects a signal related to the first solvent in gaseous phase. The signal remains constant until the first solvent completely evaporates, and the second solvent (with higher boiling point) starts to boil. At this point, replacing the first solvent in the overhead space with the second solvent in gaseous phase alters the output signal of the electroluminescent device.

Example 6: Voltage Sweep

In another example, the time-varying electrical signal transmitting terminal of the power source was connected to one end of the EL device. The EL device was placed against a photosensor with the photosensor having a light intensity threshold. The other end of the EL device was connected to a wire that was fixed inside the container so that the bottom of the wire was level with the bottom of the container and goes alongside the height of the container. The container was filled with water whose level was to be measured. A threshold electromagnetic radiation is determined in advance. The time-varying electrical signal was varied for each unknown volume of water samples until the predetermined electromagnetic radiation threshold was reached. The time-varying electrical signal was related to the volume of the water sample.

In one example, the input voltage of a power supply was varied until the electromagnetic radiation output of the electroluminescent device reached 1000 RLUs for three unknown volumes of water. The volume of the water samples were derived from a calibration curve of voltage and water volume.

Example 7: (Solution Potential)

In another example, the objective was to measure the electrical potential of a solution. To achieve this, the time-varying electrical signal transmitting terminal of the power source was connected to the first terminal of an LED. The LED was placed against a photosensor and the other terminal of the LED was connected to a wire, that extended to a container filled with water. The time-varying electrical signal transmitting terminal of a second power source was also placed inside the water container. Changing the amplitude of the time-varying electrical signal of the second power source altered the electromagnetic radiation of the electroluminescent device. In some examples, the second power source was fed by an electrochemical cell, and the electromagnetic radiation was related to the potential of the electrochemical cell.

In another example, the above setup was used while the content of the container was changed with known volumes of solutions with unknown physical properties. Electromagnetic radiation was related to unknown physical properties of the solutions.

Experiment 8: (Latent Fingerprint)

In one embodiment, the present methods may be employed in producing a signal for creating an image of a fingerprint for identification or security purposes. The present methods can be applied to imaging other areas of skin, regions of other animal bodies and even inanimate objects and for obtaining information about the properties, including the size or surface characteristics such as textures of objects in contact.

Such a portion of tissue or tissue section is conveniently applied or adhered to a conventional glass slide of the type used in microscopy techniques. Such sections may be of any convenient thickness and thus are not particularly limited in this regard. Use of semiconductor phosphor particles of sufficiently small size or diameter permits microscopic imaging to be performed.

The present example ten describes application of a method for electroluminescent illustration of a latent fingerprint lifted from a surface of an object. In this example, the fingerprint of a subject was formed on the surface of a glass slide by pressing a finger to the surface. A sample of EL phosphor powder was sprinkled over the surface of the glass slide, thus adhering to residual substances from the fingertip that were left on the glass surface, and the excess powder was dusted off using a brush. Then a clear tape was used to pick up the residue of the EL phosphor powder whose shape and distribution reproduced the pattern of the subject's fingerprint, from the glass slide. To construct the EL device, the tape with the phosphor powder removed from the surface of the glass slide was fixed on the conductive side of an ITO glass. Then one wire of the power source was connected to the ITO glass. The ITO glass was placed against a flat conductive surface as counter electrode, so that the backside of the tape contacted the conductive surface. The patterned phosphor powder emitted luminescence, reproducing the pattern of the fingerprint. In a separate example, the same method was used for mapping the surface features of another object. For this the EL phosphor powder was sprinkled over the surface of the object (coin in this example), then a clear tape was used to pick up the EL phosphor powder from the object, duplicating the features of the surface. The EL of the phosphor powder illustrated the surface features of the object.

Example 9: Topography of Conductive Surfaces

In this example the EL device (sensor) was prepared by sandwiching EL phosphor powder between the conductive side of ITO plastic and a dielectric (clear tape in this example). The hot wire of a power source was connected to the ITO plastic. The sensor was placed against the surface of a conductive object with a surface feature, so that the conductive object with a surface feature was acting as the counter-electrode. The resulting electroluminescent image illustrated the feature on the surface of the conductive object.

In another example, the EL device (sensor) was prepared by sandwiching EL phosphor powder between the conductive side of ITO plastic and a dielectric (clear tape in this example). Using a razor blade, a fine scratch was made on the surface of an Al plate. The sensor was placed against the Al plate, so that the Al plate acted as counter-electrode. The resulting electroluminescent image illustrated the scratch map on the surface of the Al plate.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electroluminescent method for measuring a physical property of an object comprising:
   a. transmitting a time-varying electrical signal from a power source to a first terminal of an electroluminescent device, wherein the electroluminescent device remains at open circuit in relation to the power source;
   b. positioning an object in close proximity to the electroluminescent device while the time-varying electrical signal is transmitted to the electroluminescent device, such that the physical property of the object alters the time-varying electrical signal across the electroluminescent device and thereby changes electromagnetic radiation emitted by the electroluminescent device;
   c. measuring the change in electromagnetic radiation emitted by the electroluminescent device; and
   d. relating the measured change in electromagnetic radiation to the physical property of the object.

2. The method of claim 1 wherein more than one physical property is measured.

3. The method of claim 1 wherein more than one time-varying electrical signal is used.

4. The method of claim 1 wherein more than one electroluminescent device is used.

5. The method of claim 1 wherein the object is separated from the electroluminescent device by a dielectric material.

6. The method of claim 1 wherein the electroluminescent device has more than two terminals.

7. The method of claim 1 is coupled with a closed-circuit electroluminescent method.

8. The method of claim 1 wherein the physical property is selected from the group consisting of volume, mass, area, length, distance, position, orientation, speed, acceleration, displacement, density, concentration in a solution, pH, ionic strength, chemical composition, ratio of two substances in admixture, polarity, electrical potential, electrical charge content, conductivity, resistivity, capacitance, temperature, magnetic permeability, electric permittivity, refractive index, current density, vibration, oscillation, displacement, strain, stress, pressure, reflectivity, transparency, color, relative brightness, texture, rigidity, geometry, moisture content, absorptivity, energy, intensity, amplitude, frequency, mass-to-charge ratio, impurity, connectivity, mobility, viscosity, and pattern.

9. The method of claim 1 wherein the electrical signal is comprised of a plurality of waveforms.

10. The method of claim 1 wherein the electroluminescent device comprises materials selected from the group consisting of organic light emitting diodes, inorganic light emitting diodes, electroluminescent quantum dots, electroluminescent nanocrystals, inert gases, and combinations thereof.

11. The method of claim 1 wherein the electroluminescent device comprises materials that convert electrical energy into thermal energy.

12. The method of claim 1 wherein the electroluminescent device emits in infrared to ultraviolet wavelengths.

13. The method of claim 1 wherein the electroluminescent device is comprised of a combination of luminescent materials.

14. The method of claim 1 wherein the object is in solid phase.

15. The method of claim 1 wherein the object is in liquid phase.

16. The method of claim 1 wherein the object is in gas phase.

17. The method of claim 1 wherein the object is an environmental condition.

18. The method of claim 1 wherein the electrical signal is transmitted wirelessly from the power source to the electroluminescent device.

19. The method of claim 18 further comprising:
   e. transmitting a time-varying electrical signal from the power source to a primary coil;
   f. coupling a secondary coil to the primary coil, such that the time-varying electrical signal in the primary coil induces a time-varying signal in the secondary coil; and
   g. attaching the secondary coil to a first terminal of an electroluminescent device.

20. The method of claim 2 wherein measuring more than one physical property comprises measuring different properties of one object.

21. The method of claim 2 wherein measuring more than one physical property comprises measuring one property of different objects.

22. The method of claim 1 wherein the same physical property of a plurality of objects is measured.

23. The method of claim 1 wherein a property of the time-varying electrical signal is adjusted.

24. The method of claim 23 wherein the adjusting property of the time-varying electrical signal is selected from the group consisting of amplitude, frequency, waveform, current, phase angle, or a combination thereof.

25. The method of claim 23 wherein the adjustment in the time-varying electrical signal and the change in the electromagnetic radiation are related to the physical property of the object.

26. The method of claim 25 wherein a voltage input to the power source is adjusted to change the time-varying electrical signal being transmitted to the electroluminescent device and thereby cause the electromagnetic radiation to be emitted at a preselected intensity, and relating the input voltage to the property of the object.

27. An electroluminescent method for measuring a physical property of an object comprising:
   a. transmitting a time-varying electrical signal from a power source to a first terminal of an electroluminescent device and a circuit component, wherein the electroluminescent device and the circuit component remain at open circuit;
   b. positioning an object in close proximity to the circuit component, such that a change in physical property of the object alters the time-varying electrical signal across the circuit component and the electroluminescent device and thereby changes electromagnetic radiation emitted by the electroluminescent device;
   c. measuring the change in electromagnetic radiation emitted by the electroluminescent device; and
   d. relating the measured change in electromagnetic radiation to a physical property of the object.

28. The method of claim 27 wherein the circuit component and the electroluminescent device are configured in a series configuration, parallel configuration, or a combination thereof.

29. The method of claim 27 wherein the circuit component is a resistor, wherein the resistor measures electrical resistivity of the object.

30. The method of claim 27 wherein the circuit component is a capacitor, wherein the capacitor measures capacitive properties of the object.

31. The method of claim 27 wherein the circuit component is an inductor, wherein the inductor measures inductive properties of the object.

32. The method of claim 27 wherein the circuit component is a photodiode, wherein the photodiode measures optical properties of the object.

33. The method of claim 32 wherein the photodiode is selected from the group consisting of photovoltaic cells, thermophotovoltaics, thermopile, and photodetectors.

34. The method of claim 27 wherein the circuit component is a thermocouple, wherein the thermocouple measures thermal properties of the object.

35. The method of claim 27 wherein the circuit component is a piezoelectric sensor, wherein the piezoelectric sensor measures a mechanical property of the object.

36. The method of claim 27, wherein the circuit component is an electrochemical cell, wherein the electrochemical cell measures electrical potential of the object.

37. The method of claim 27 wherein the physical property is selected from the group consisting of volume, mass, area, length, distance, position, orientation, speed, acceleration, displacement, density, concentration in a solution, pH, ionic strength, ratio of two substances in admixture, polarity, conductivity, resistivity, capacitance, temperature, permeability, permittivity, refractive index, current density, vibration, oscillation, displacement, strain, stress, pressure, reflectivity, transparency, color, relative brightness, texture, rigidity, geometry, moisture content, absorptivity, energy, intensity, amplitude, frequency, mass-to-charge ratio, impurity, connectivity, mobility, viscosity, and pattern.

38. The method of claim 27 wherein more than one circuit component is used.

39. The method of claim 27 wherein the circuit component is disposed in an insulating material.

40. The method of claim 27 wherein the circuit component and the electroluminescent device are configured in series.

41. The method of claim 27 wherein the circuit component and the electroluminescent device are configured in parallel.

42. The method of claim 27 wherein the object is a second circuit component.

43. The method of claim 42 wherein the second circuit component is selected from the group consisting of a resistor, inductor, electrochemical cell, direct current power supply, and time-varying power supply.

44. The method of claim 27 wherein the electrical signal is transmitted wirelessly from the power source to the electroluminescent device.

45. The method of claim 44 further comprising:
  e. transmitting a time-varying electrical signal from the power source to a primary coil;
  f. coupling a secondary coil to the primary coil, such that the time-varying electrical signal in the primary coil induces a time-varying signal in the secondary coil; and
  g. attaching the secondary coil to a first terminal of an electroluminescent device.

* * * * *